US008659930B2

(12) United States Patent
Yim et al.

(10) Patent No.: US 8,659,930 B2
(45) Date of Patent: Feb. 25, 2014

(54) NON-VOLATILE MEMORY DEVICE

(75) Inventors: Hyuck-Sang Yim, Gyeonggi-do (KR);
Kwang-Seok Kim, Gyeonggi-do (KR);
Taek-Sang Song, Gyeonggi-do (KR);
Chul-Hyun Park, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 83 days.

(21) Appl. No.: 13/340,074

(22) Filed: Dec. 29, 2011

(65) Prior Publication Data
US 2013/0070512 A1   Mar. 21, 2013

(30) Foreign Application Priority Data
Sep. 19, 2011 (KR) ........................ 10-2011-0094211

(51) Int. Cl.
*G11C 11/00* (2006.01)
(52) U.S. Cl.
USPC .................. 365/148; 365/189.07; 365/189.09
(58) Field of Classification Search
USPC ............ 365/148, 163, 185.2, 185.21, 185.24, 365/189.09, 189.07, 210.12
See application file for complete search history.

(56) References Cited

U.S. PATENT DOCUMENTS

| | | | | |
|---|---|---|---|---|
| 6,970,387 B2* | 11/2005 | Smith et al. | ............... | 365/189.16 |
| 7,324,370 B2* | 1/2008 | Smith et al. | .................. | 365/158 |
| 7,542,337 B2* | 6/2009 | Scheuerlein et al. | ..... | 365/185.03 |
| 7,542,338 B2* | 6/2009 | Scheuerlein et al. | ..... | 365/185.03 |
| 8,098,518 B2* | 1/2012 | Kim et al. | ...................... | 365/163 |
| 8,385,109 B2* | 2/2013 | Park | ............................ | 365/163 |

FOREIGN PATENT DOCUMENTS

KR   10-2010-0049926   5/2010
KR   10-2011-0119276   11/2011

* cited by examiner

*Primary Examiner* — Gene Auduong
(74) *Attorney, Agent, or Firm* — IP & T Group LLP

(57) ABSTRACT

A non-volatile memory device includes a memory cell including a resistance variable device and a switching unit for controlling a current flowing through the resistance variable device; a read reference voltage generator configured to generate a reference voltage according to a skew occurring in the switching unit; and a sense amplifier configured to sense a voltage corresponding to the current that flows through the resistance variable device based on the reference voltage.

13 Claims, 3 Drawing Sheets

NON-VOLATILE MEMORY DEVICE

CROSS-REFERENCE TO RELATED APPLICATIONS

The present application claims priority of Korean Patent Application No. 10-2011-0094211, filed on Sep. 19, 2011, which is incorporated herein by reference in its entirety.

BACKGROUND

1. Field

Exemplary embodiments of the present invention relate to a semiconductor designing technology, and more particularly, to a non-volatile memory device.

2. Description of the Related Art

Non-volatile memory devices are memory device that retain data stored therein even though a power source is cut off, and examples of the non-volatile memory devices include a flash memory and a Phase Change Random Access Memory (PCRAM). In particular, a PCRAM is a memory device that stores a data in a memory cell by forming the memory cell of a phase change material, such as germanium-antimony-tellurium (GST), heating the GST to make the GST in a crystal state or an amorphous state. The PCRAM has a data processing rate as fast as a volatile memory device, e.g., RAM.

FIG. 1 is a block diagram of a conventional PCRAM.

Referring to FIG. 1, the PCRAM 10 employs a pumping voltage VPPSA domain, and uses a method of transferring a sensing current through a memory cell D (GST) path under the control of signals BIAS, CLMBL and VCLAMP for current mirror. Herein, although not illustrated in a sensing node VSAI, a voltage latch is coupled thereto, and the voltage latch senses the voltage levels of the sensing node VSAI that vary according to the resistance value of the GST. That is, when the sensing node VSAI is pre-charged with a pumping voltage VPPSA and then the sensing node VSAI is discharged according to the voltage condition Vgs and Vds of a transistor NN for clamping, the voltage latch senses the voltage level of the sensing node VSAI when a current flowing through a transistor P for bias become substantially identical to a current flowing through the transistor NN for clamping.

However, when the GST has a higher resistance value, an RC time constant existing in a memory cell D (GST) path may be affected by the higher resistance. As a result, when the sensing node VSAI is discharged, the conventional PCRAM 10 may take a long time to stabilize the sensing node VSAI.

SUMMARY

An exemplary embodiment of the present invention is directed to a non-volatile memory device with improved sensing speed.

Another exemplary embodiment of the present invention is directed to a non-volatile memory device that compensates for a skew occurring in a switch included in a memory cell.

In accordance with an exemplary embodiment of the present invention, a non-volatile memory device includes a memory cell including a resistance variable device and a switching unit for controlling a current flowing through the resistance variable device, a read reference voltage generator conFIG.ured to generate a reference voltage according to a skew occurring in the switching unit, and a sense amplifier conFIG.ured to sense a voltage corresponding to the current that flows through the resistance variable device based on the reference voltage.

In accordance with another exemplary embodiment of the present invention, a non-volatile memory device includes a first comparator conFIG.ured to compare a first sense voltage with a first reference voltage and to generate a first comparison signal, a first driver conFIG.ured to drive a first sense voltage terminal with a first power source voltage in response to the first comparison signal, a memory cell coupled between the first sense voltage terminal and a second power source voltage terminal and including a resistance variable device and a first switch coupled in series, a second switch coupled between a first reference voltage terminal and a dividing voltage terminal and being identical to the first switch, a resistor coupled through the second switch to the dividing voltage terminal and coupled to the second power source voltage terminal, a second comparator conFIG.ured to compare a dividing voltage with the second reference voltage and to generate a second comparison signal, and a second driver conFIG.ured to drive the first reference voltage terminal with the first power source voltage in response to the second comparison signal.

In accordance with another exemplary embodiment of the present invention, a non-volatile memory device includes a first comparator conFIG.ured to compare a first sense voltage with a first reference voltage and to generate a first comparison signal, a first driver conFIG.ured to drive a first sense voltage terminal with a first power source voltage in response to the first comparison signal, a memory cell coupled between the first sense voltage terminal and a second power source voltage terminal and including a resistance variable device and a switch coupled in series, a second driver conFIG.ured to drive a second sense voltage terminal with the first power source voltage in response to the first comparison signal, and a voltage controller conFIG.ured to control a voltage level of the second sense voltage terminal based on a reference current.

DETAILED DESCRIPTION

Figure 1:
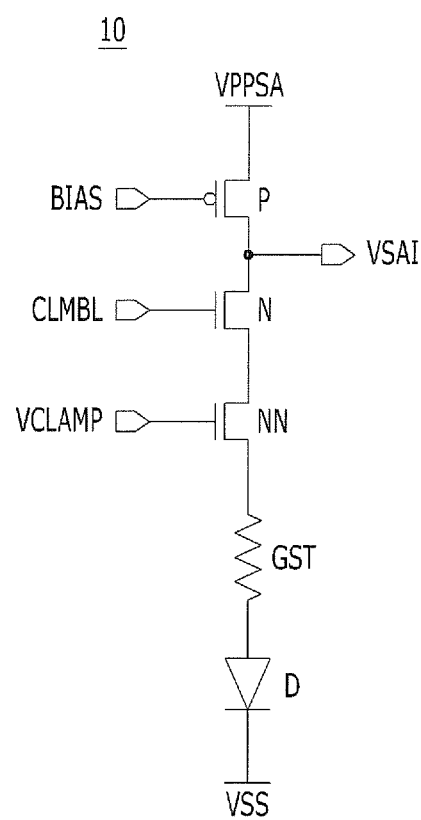
FIG. 1 is a block diagram of a conventional Phase Change Random Access Memory (PCRAM).

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various FIG.ures and exemplary embodiments of the present invention.

Hereafter, a Phase Change Random Access Memory (PCRAM) device is taken as an example and described in the following exemplary embodiment of the present invention.

Figure 2:
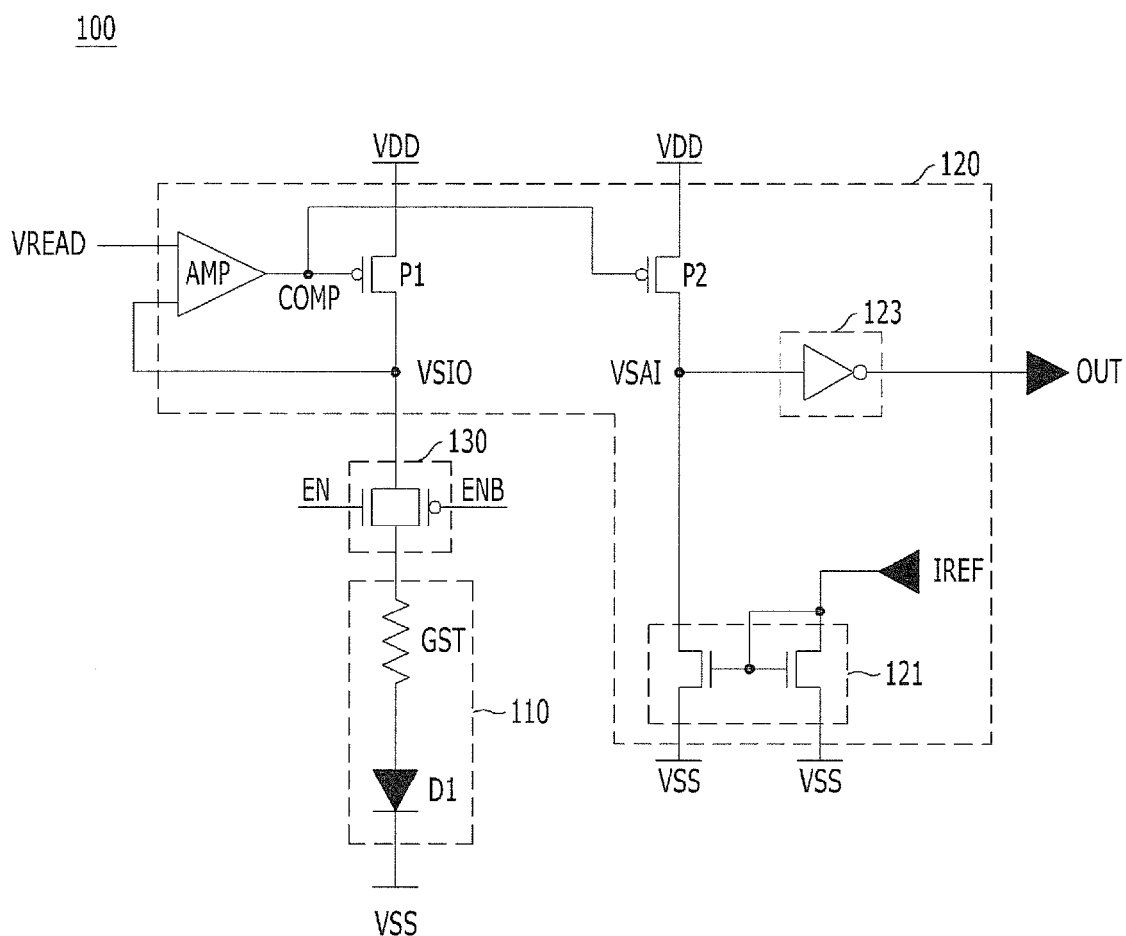
FIG. 2 is a block diagram of a non-volatile memory device in accordance with a first exemplary embodiment of the present invention.

FIG. 2 is a block diagram of a PCRAM device 100 in accordance with a first exemplary embodiment of the present invention.

Referring to FIG. 2, the PCRAM device 100 includes a memory cell 110, a sense amplifier 120, and a switch unit 130. The sense amplifier 120 senses and amplifies the voltage level of a first sense voltage (VSIO) terminal based on a read reference voltage VREAD. The switch unit 130 selectively couples the first sense voltage (VSIO) terminal with one end of the memory cell 110 in response to an enable signal EN and ENB.

Herein, the memory cell 110 includes a resistance variable element GST including a phase change material, and a switching element D1 for controlling a current flowing through the resistance variable element GST.

The sense amplifier 120 includes a comparison unit AMP, a first driving unit P1, a second driving unit P2, a voltage control unit 121, and an output unit 123. The comparison unit AMP compares the read reference voltage VREAD with a first sense voltage (VSIO). The first driving unit P1 drives the first sense voltage (VSIO) terminal with a high power source voltage VDD in response to a comparison signal COMP outputted from the comparison unit AMP. The second driving unit P2 drives a second sense voltage (VSAI) terminal with the high power source voltage VDD in response to the comparison signal COMP. The voltage control unit 121 controls the voltage level of the second sense voltage (VSAI) terminal based on a reference current IREF. The output unit 123 outputs a second sense voltage VSAI. Herein, the comparison unit AMP functions as a unit-gain buffer, and the second driving unit P2 functions as a current multiplier. For example, the second driving unit P2 may function as a current multiplier simply by adjusting the size of a transistor.

Hereafter, the operation of the PCRAM device 100 having the above-described structure is described in accordance with the first exemplary embodiment of the present invention.

When an enable signal EN and ENB for selecting a memory cell 110 is enabled, the sense amplifier 120 senses and amplifies a data stored in the resistance variable element GST and outputs an amplified data. That is, as the comparison unit AMP and the first driving unit P1 rapidly stabilize the voltage level of the first sense voltage (VSIO) terminal into the read reference voltage VREAD, a current corresponding to a resistance value of the resistance variable element GST flows through the first sense voltage (VSIO) terminal. The current flowing through the first driving unit P1 and the resistance variable element GST becomes the same as the current flowing through the first sense voltage (VSIO) terminal. Herein, a current corresponding to the current flowing through the first driving unit P1 flows in the second driving unit P2. That is, since the second driving unit P2 is a current multiplier, a current amplified from the current flowing through the first driving unit P1 flows through the second driving unit P2. Accordingly, the voltage level of the second sense voltage VSAI is decided as the current flowing through the second driving unit P2 and the current flowing through the voltage control unit 121 FIG.ht each other. That is, when the current flowing through the second driving unit P2 is greater than the reference current IREF flowing through the voltage control unit 121, the second sense voltage (VSAI) terminal is coupled with the high power source voltage (VDD) terminal. On the other hand, when the reference current IREF flowing through the voltage control unit 121 is greater than the current flowing through the second driving unit P2, the second sense voltage (VSAI) terminal is coupled with a low power source voltage (VSS) terminal.

According to the first exemplary embodiment of the present invention, although the resistance variable element GST has a high resistance value, the data stored in the memory cell 110 may be rapidly sensed and amplified regardless of RC delay.

Meanwhile, in the first exemplary embodiment of the present invention, the switching element D1 included in the memory cell 110 is formed of a diode, a diode skew may occur due to a variation in process and temperature. In this case, the skew may directly affect the current flowing through the resistance variable element GST, and thus the sense amplifier 120 recognizes that the resistance value of the resistance variable element GST is changed. That is, when a diode skew occurs in the switching element D1 due to a variation in the process and temperature and thus the voltage across both ends of the resistance variable element GST is changed, the current flowing through the resistance variable element GST is changed. As a result, the change in the current flowing through the resistance variable element GST may decrease the sensing margin of the sense amplifier 120. To address the concern, the following second exemplary embodiment of the present invention is provided.

Figure 3:
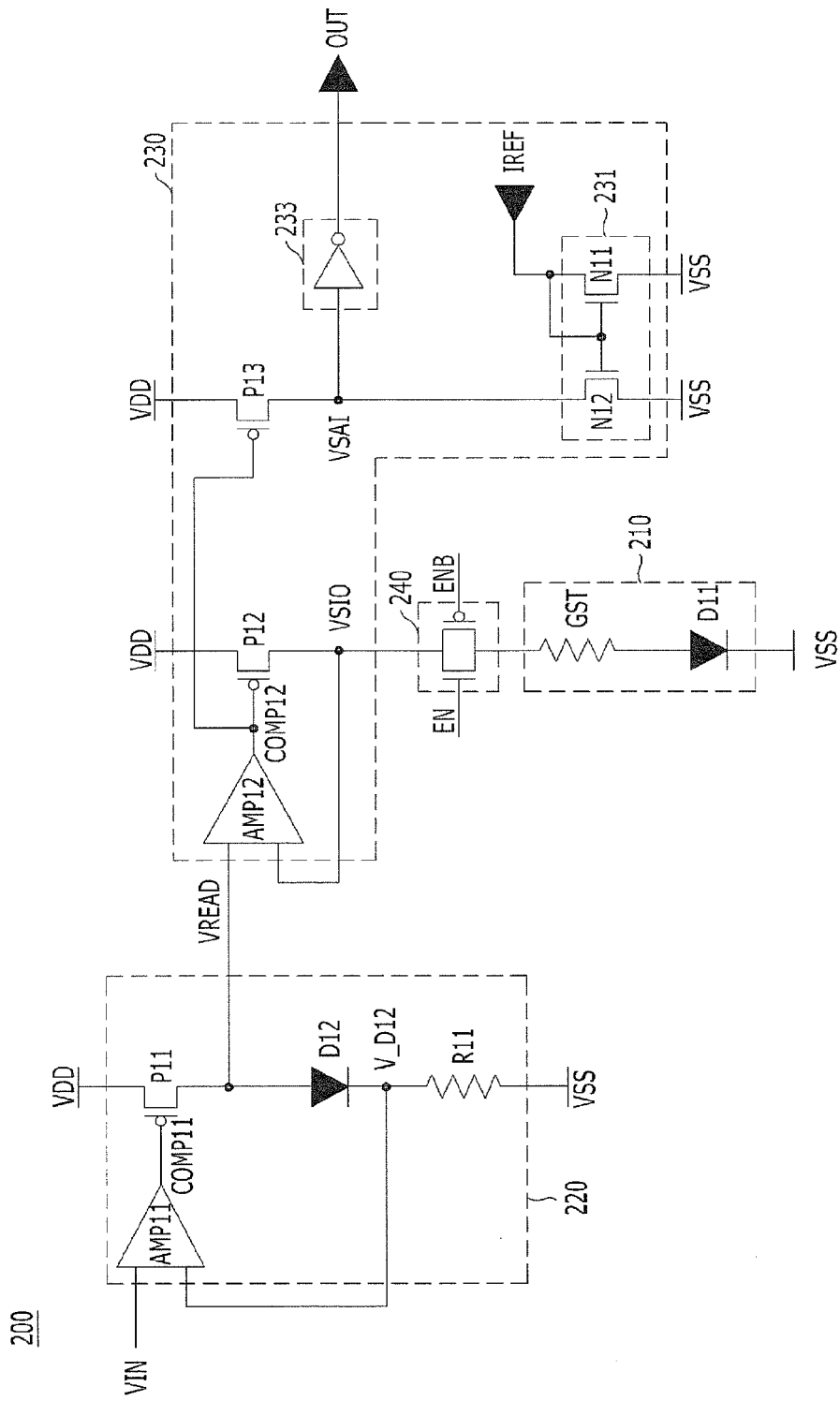
FIG. 3 is a block diagram of a non-volatile memory device in accordance with a second exemplary embodiment of the present invention.

FIG. 3 is a block diagram of a PCRAM device 200 in accordance with a second exemplary embodiment of the present invention.

Referring to FIG. 3, the PCRAM device 200 includes a memory cell 210, a read reference voltage generator 220, a sense amplifier 230, and a switch unit 240. The memory cell 210 includes a resistance variable element GST containing a phase change material and a first switching element D11 for controlling the current flowing through the resistance variable element GST coupled in series. The read reference voltage generator 220 variably generates a read reference voltage VREAD according to the skew occurring in the first switching element D11. The sense amplifier 230 senses and amplifies the voltage level of the first sense voltage (VSIO) terminal based on the read reference voltage VREAD. The switch unit 240 selectively couples the first sense voltage (VSIO) terminal with one end of the memory cell 210 in response to the enable signal EN and ENB.

The first switching element D11 included in the memory cell 210 may be realized by using, for example, a diode.

The read reference voltage generator 220 includes a second switching element D12 that is designed the same as the first switching element D11 and detects a skew occurring in the second switching element D12 or D11. Herein, since the skew is detected by detecting the voltages between both ends of the second switching element D12, the read reference voltage generator 220 may be designed in the type of a regulator. The read reference voltage generator 220 includes the second switching element D12, a resistor unit R11, a first comparison unit AMP11, and a first driving unit P11. The second switching element D12 is coupled between the read reference voltage VREAD end and a dividing voltage (V_D12) terminal and is designed the same as the first switching element D11. The resistor unit R11 is coupled between the dividing voltage (V_D12) terminal and a low power source voltage (VSS) terminal and has a fixed resistance value. The first comparison unit AMP11 compares the dividing voltage (V_D12) with a reference voltage VIN. The first driving unit P11 drives the read reference voltage (VREAD) terminal with the high power source voltage VDD in response to a comparison signal COMP11 outputted from the first comparison unit AMP11.

The sense amplifier 230 senses a current flowing through the resistance variable element GST based on the read reference voltage VREAD and amplifies the variation of the current flowing through the resistance variable element GST based on the reference current IREF. The sense amplifier 230 includes a second comparison unit AMP12, a second driving unit P12, a third driving unit P13, a voltage control unit 231, and an output unit 232. The second comparison unit AMP12 compares the first sense voltage (VSIO) with the read reference voltage VREAD. The second driving unit P12 drives the first sense voltage (VSIO) terminal with the high power source voltage VDD in response to a second comparison signal COMP12 outputted from the second comparison unit AMP12. The third driving unit P13 drives the second sense voltage (VSAI) terminal with the high power source voltage VDD in response to the second comparison signal COMP12. The voltage control unit 231 controls the voltage level of the second sense voltage (VSAI) terminal based on the reference current IREF. The output unit 232 outputs the second sense voltage (VSAI) as an amplified signal OUT. Herein, the second comparison unit AMP12 functions as a unit-gain buffer, and the third driving unit P13 functions as a current multiplier. The third driving unit P13 may function as a current multiplier simply by adjusting a transistor in a different size. The voltage control unit 231 includes two NMOS transistors N11 and N12 for mirroring the reference current IREF.

Described hereafter is the operation of the PCRAM device 200 in accordance with the second exemplary embodiment of the present invention.

When the enable signal EN and ENB for selecting a memory cell 210 is enabled, the sense amplifier 230 senses and amplifies the data stored in the memory cell 210 and outputs an amplified signal OUT. As the second comparison unit AMP12 and the second driving unit P12 rapidly stabilizes the voltage level of the first sense voltage (VSIO) terminal into the read reference voltage VREAD, a current corresponding to a resistance value of the resistance variable element GST flows through the first sense voltage (VSIO) terminal. The current flowing through the second driving unit P12 and the resistance variable element GST becomes the same as the current flowing through the first sense voltage (VSIO) terminal. Herein, a current corresponding to the current flowing through the second driving unit P12 flows through the third driving unit P13. Since the third driving unit P13 is a current multiplier, a current amplified more than the current flowing through the second driving unit P12 flows through the third driving unit P13. Accordingly, the voltage level of the second sense voltage (VSAI) terminal is decided by combining the current flowing through the third driving unit P13 and the reference current IREF flowing through the voltage control unit 231. That is, when the current flowing through the third driving unit P13 is greater than the reference current IREF flowing through the voltage control unit 231, the second sense voltage (VSAI) terminal is coupled with the high power source voltage (VDD) terminal. Conversely, when the reference current IREF flowing through the voltage control unit 231 is greater than the current flowing through the third driving unit P13, the second sense voltage (VSAI) terminal is coupled with the low power source voltage (VSS) terminal.

Herein, the current flowing through the resistance variable element GST is represented by the following Equation 1.

$$I_{GST}=(VSIO-Vth\_D11)/R_{GST} \quad \text{Equation 1}$$

where '$I_{GST}$' denotes a current flowing through the resistance variable element GST; 'Vth_D11' denotes a voltage between both ends of the first switching element D11; '$R_{GST}$' denotes a resistance value of the resistance variable element GST.

Therefore, the sense amplifier 230 may sense the variation of resistance value of the resistance variable element GST by sensing the current $I_{GST}$ that flows through the resistance variable element GST while the first sense voltage (VSIO) and the voltage Vth_D11 between both ends of the first switching element D11 are decided.

Meanwhile, when a skew occurs in the first switching element D11 due to a variation in process and temperature, the current $I_{GST}$ flowing through the first switching element D11 varies due to a change in the voltage Vth_D11 between both ends of the first switching element D11 although the resistance value of the resistance variable element GST is the same as the previous conditions. This may be represented by the following Equation 2.

$$I_{GST}=(VSIO-Vth\_D11-V\_SKEW)/R_{GST} \quad \text{Equation 2}$$

where 'V_SKEW' denotes a skew occurring in the first switching element D11. When a skew V_SKEW occurs in the first switching element D11, the read reference voltage generator 220 varies the read reference voltage VREAD according to the skew V_SKEW. For example, when the voltage Vth_D11 between both ends of the resistance variable element GST is decreased as much as the skew V_SKEW occurring in the first switching element D11, the read reference voltage generator 220 detects the skew V_SKEW occurs in the second switching element D12 and increases the read reference voltage VREAD based on the detection result. Herein, since the second switching element D12 is a diode that is designed the same as the first switching element D11, the same skew V_SKEW occurring in the first switching element D11 also occurs in the second switching element D12. Therefore, read reference voltage generator 220 adaptively outputs a result reflecting the skew V_SKEW occurring in the first switching element D11. As a result, the sense amplifier 230 increases the voltage level of the first sense voltage (VSIO) terminal according to the increased read reference voltage VREAD. Thus, as the voltages at both ends of the resistance variable element GST are increased, the current $I_{GST}$ that flows through the resistance variable element GST is compensated to a current level before the skew occurs.

In accordance with the second exemplary embodiment of the present invention, the sensing margin of the sense amplifier 230 may be improved by controlling the read reference voltage VREAD inputted to the sense amplifier 230 according to the skew V_SKEW occurring in the first switching element D11, thereby compensating for the variation of the current flowing through the resistance variable element GST.

According to an exemplary embodiment of the present invention, the sensing speed is improved by adopting a regulator method.

Also, although a skew occurs in a switch included in a memory cell, it may be possible to maintain a current flowing through a memory cell path at a uniform level by varying the reference voltage inputted to a sense amplifier in response to the skew occurring in the switch. Therefore, the sensing margin of the sense amplifier may be improved by adjusting the reference voltage inputted to the sense amplifier and thereby compensating for the variation of the current flowing through the memory cell path upon the occurrence of the skew.

While the present invention has been described with respect to the specific embodiments, it will be apparent to those skilled in the art that various changes and modifications may be made without departing from the spirit and scope of the invention as defined in the following claims.

What is claimed is:
1. A non-volatile memory device, comprising:
 a first comparator configured to compare a first sense voltage with a first reference voltage and to generate a first comparison signal;

a first driver configured to drive a first sense voltage terminal with a first power source voltage in response to the first comparison signal;

a memory cell coupled between the first sense voltage terminal and a second power source voltage terminal and including a resistance variable device and a first switch coupled in series;

a second switch coupled between a first reference voltage terminal and a dividing voltage terminal and being identical to the first switch;

a resistor coupled through the second switch to the dividing voltage terminal and coupled to the second power source voltage terminal;

a second comparator configured to compare a dividing voltage with the second reference voltage and to generate a second comparison signal; and a second driver configured to drive the first reference voltage terminal with the first power source voltage in response to the second comparison signal.

2. The non-volatile memory device of claim 1, wherein the first switch comprises a diode.

3. The non-volatile memory device of claim 1, further comprising:

a third driver configured to drive a second sense voltage terminal with the first power source voltage in response to the first comparison signal; and a voltage controller configured to control a voltage level of the second sense voltage terminal based on a reference current.

4. The non-volatile memory device of claim 3, wherein the third driver comprises a current multiplier.

5. The non-volatile memory device of claim 3, wherein the voltage controller has a structure for mirroring the reference current between the second sense voltage terminal and the second power source voltage terminal.

6. The non-volatile memory device of claim 1, further comprising:

a switch unit configured to selectively couple the first sense voltage terminal with one end of the memory cell in response to an enable signal for selecting the memory cell.

7. A non-volatile memory device comprising:

a first comparator configured to compare a first sense voltage with a first reference voltage and to generate a first comparison signal;

a first driver configured to drive a first sense voltage terminal with a first power source voltage in response to the first comparison signal;

a memory cell coupled between the first sense voltage terminal and a second power source voltage terminal and including a resistance variable device and a switch coupled in series;

a second driver configured to drive a second sense voltage terminal with the first power source voltage in response to the first comparison signal; and a voltage controller configured to control a voltage level of the second sense voltage terminal based on a reference current.

8. The non-volatile memory device of claim 7, wherein the first reference voltage is determined adaptively to a skew occurring in the switch.

9. The non-volatile memory device of claim 8, further comprising:

a second switch coupled between a first reference voltage terminal and a dividing voltage terminal and being identical to the first switch;

a resistor coupled through the second switch to the dividing voltage terminal and coupled to the second power source voltage terminal;

a second comparator configured to compare a dividing voltage with the second reference voltage and to generate a second comparison signal; and a third driver configured to drive the first reference voltage terminal with the first power source voltage in response to the second comparison signal.

10. The non-volatile memory device of claim 7, wherein the first switch comprises a diode.

11. The non-volatile memory device of claim 7, further comprising:

a switch unit configured to selectively couple the first sense voltage terminal with one end of the memory cell in response to an enable signal for selecting the memory cell.

12. The non-volatile memory device of claim 7, wherein the second driver comprises a current multiplier.

13. The non-volatile memory device of claim 7, wherein the voltage controller has a structure for mirroring the reference current between the second sense voltage terminal and the second power source voltage terminal.

\* \* \* \* \*